(12) United States Patent
Koyama et al.

(10) Patent No.: US 7,737,367 B2
(45) Date of Patent: Jun. 15, 2010

(54) MULTILAYER CIRCUIT BOARD AND MANUFACTURING METHOD THEREOF

(75) Inventors: Masayoshi Koyama, Osaka (JP); Yoshitake Hayashi, Osaka (JP); Kazuo Otani, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/338,771

(22) Filed: Jan. 25, 2006

(65) Prior Publication Data

US 2006/0191715 A1  Aug. 31, 2006

(30) Foreign Application Priority Data

Jan. 26, 2005  (JP)  ............................ 2005-018651

(51) Int. Cl.
*H01R 12/04*  (2006.01)
*H05K 1/11*  (2006.01)

(52) U.S. Cl. ...................................... 174/264; 174/262

(58) Field of Classification Search ................ 174/262, 174/263, 264, 265, 266
See application file for complete search history.

(56) References Cited

U.S. PATENT DOCUMENTS

| | | | | |
|---|---|---|---|---|
| 5,117,069 A * | 5/1992 | Higgins, III | ................ | 174/261 |
| 5,210,940 A * | 5/1993 | Kawakami et al. | ............ | 29/852 |
| 6,252,176 B1 * | 6/2001 | Kuramochi et al. | ......... | 174/255 |
| 6,395,378 B2 * | 5/2002 | Bergstedt et al. | ............ | 428/209 |
| 6,492,597 B2 * | 12/2002 | Fujii et al. | .................. | 174/255 |
| 6,531,022 B1 * | 3/2003 | Tsukahara | .................. | 156/256 |
| 6,555,208 B2 * | 4/2003 | Takada et al. | ............... | 428/209 |

(Continued)

FOREIGN PATENT DOCUMENTS

JP   7-147464   6/1995

(Continued)

OTHER PUBLICATIONS

Kiyoshi Takagi, "*Build-up Multiplayer Printed Circuit Board Technology*," The Nikkan Kygyo Shimbun. Ltd, Published on Jun. 15, 2001, First Edition, Second printed version, pp. 53-76, together with an English language translation of the same.

(Continued)

*Primary Examiner*—Ishwarbhai B Patel
(74) *Attorney, Agent, or Firm*—Greenblum & Bernstein, P.L.C.

(57) ABSTRACT

Holes having the same diameter as via holes are formed in predetermined positions in advance when forming wiring patterns on releasable carriers. The carriers with the wiring patterns are bonded on an insulating material, and a laser beam is irradiated from the side of the carrier using the holes in the wiring pattern as a laser mask to form via holes in the insulating material. The via holes and the holes in the carrier are then filled with a conductive paste. With the holes in the carrier that are matched in position with the via holes, lands in the conductor layers are precisely positioned relative to the via holes. A multilayer circuit board thus produced has lower electrical connection resistance and excellent mountability with improved performances. Also a manufacturing method thereof is achieved.

4 Claims, 8 Drawing Sheets

U.S. PATENT DOCUMENTS

| | | | |
|---|---|---|---|
| 6,768,064 B2 * | 7/2004 | Higuchi et al. | 174/267 |
| 7,115,818 B2 * | 10/2006 | Kusano et al. | 174/254 |
| 7,214,419 B2 * | 5/2007 | Umeda et al. | 428/209 |
| 2006/0289203 A1 * | 12/2006 | Oda | 174/264 |

FOREIGN PATENT DOCUMENTS

| | | |
|---|---|---|
| JP | 2001-144445 | 5/2001 |
| JP | 2002-009441 | 1/2002 |
| JP | 2004-221426 | 8/2004 |

OTHER PUBLICATIONS

English Language Abstract of JP 7-147464.
English Language Abstract of JP 2004-221426.
English language Abstract of JP 2001-144445.
English language Abstract of JP 2002-009441.

* cited by examiner

MULTILAYER CIRCUIT BOARD AND MANUFACTURING METHOD THEREOF

The present disclosure relates to subject matter contained in priority Japanese Patent Application No. 2005-018651 filed on Jan. 26, 2005, the contents of which is herein expressly incorporated by reference in its entirety.

BACKGROUND OF THE INVENTION

1. Field of the Invention

The present invention relates to a multilayer circuit board and a manufacturing method thereof, and more particularly to a multilayer circuit board with via holes filled with conductive paste for providing interconnection between layers and a manufacturing method thereof.

2. Description of the Related Art

As electronic equipment becomes lighter, thinner, and smaller, the size and terminal pitch of semiconductor chips and electronic components are reduced, and accordingly printed circuit boards and package boards become more densely packed. Information technology equipment now requires shorter wiring distances between chips as the signal frequency has increased. Multilayer printed circuit board (PCB) technology has become essential to build high density, high performance circuits.

The key issue of multilayer circuit boards is how to establish electrical connection between layers to form three-dimensional circuits. Double-sided boards, which are the first step to building multilayer circuit boards, are fabricated by drilling holes in an insulating material and plating the walls of the holes with a conductive material to achieve interconnection between the front and back surfaces (see, for example, "Build-up Multilayer PCB Technology" by Kiyoshi Takagi; The Nikkan Kogyo Shimbun, LTD; published on Jun. 15, 2001; first edition; second printed version; p. 53-76). Sequential build-up boards such as surface laminar circuits (SLCs) of IBM also use plating for achieving interconnection, part of the insulating layer between circuit layers being removed by laser or the like.

While the plating method has the advantage of accomplishing a low resistance connection between fine circuits, it involves complex processes and a large number of process steps, which increases the cost and poses a limitation to the application of multilayer circuit boards.

As disclosed, for example, in Japanese Patent Publication No. 7-147464, multilayer circuit boards using conductive resin paste instead of metal plating have been put in use recently and multilayer circuit boards are beginning to find wider applications.

One method of manufacturing multilayer circuit boards using conductive paste for interconnection will be briefly described with reference to FIG. 7A to FIG. 7H. FIG. 7A shows an insulating resin plate or film 71, in which via holes 72 are drilled as shown in FIG. 7B by laser. Conductive paste 73 is then filled in the via holes 72 by printing, to obtain an insulating layer 74 that has interconnecting parts at desired locations, as shown in FIG. 7C. Copper foils 75 are heat-bonded to both sides of the insulating layer 74 as shown in FIG. 7D, and wiring patterns 76 are formed in the copper foils 75 by etching as shown in FIG. 7E. These processes are repeated and several layers are bonded together (FIG. 7F to FIG. 7H) to obtain a multilayer circuit board 77.

Other methods include, as with SLCs, using a photosensitive resin for the insulating layer and forming via holes by exposure and development, or removing resin by chemical etching or dry etching.

In the meantime, the base material thickness of each laminated layer of multilayer circuit boards has reduced from approximately 0.1 mm to approximately 0.025 mm as the boards are more densely packed, especially in bare-chip multichip module packaging. Insulating films in such laminated boards tend to bend or wrinkle, because of which dimension stability is becoming hard to achieve.

Japanese Patent Publication No. 2004-221426 shows a multilayer circuit board that uses conductive paste for interconnection and that provides a solution to this problem. The manufacturing method of this multilayer circuit board is described with reference to FIG. 8A to FIG. 8D. A laminate film is first prepared, which is formed by a polyimide film 81 that will be an insulating resin layer, a copper foil provided on one surface of the film, and an adhesive layer 83 of thermoplastic polyimide bonded to the other surface of the film. A resist film is heat-bonded on the copper foil, which undergoes exposure and development to form a resist mask pattern. This is followed by chemical etching to form a circuit pattern including lands 84 and fine apertures 85. Then, a PET film is bonded on the adhesive layer 83 and via holes 86 are drilled by YAG laser. Conductive paste 82 is filled in the via holes 86 by squeezing from the front surface of the PET film. When the conductive paste 82 is dry enough, the PET film is removed. FIG. 8A shows the thus obtained board 90 that will constitute one layer in a multilayer wiring board when laminated.

Another board 91 with a circuit pattern including lands 84 and fine apertures 87 is fabricated similarly, another copper foil 88 is prepared, and as shown in FIG. 8B, fine apertures 87 are formed by etching in the copper foil at positions corresponding to the via holes.

Next, as shown in FIG. 8C, the boards 90 and 91 and the copper foil 88 are superposed such that the via holes 86, the lands 84, and the fine apertures 87 are precisely matched in position.

The boards 90 and 91 and the copper foil 88 are then united by applying heat and pressure, as shown in FIG. 8D. The copper foil 88 is etched to form lands 89, to complete a three-layer board.

With this method, while using a thin film, a high rigidity is achieved because fabrication of each layer starts from a copper clad laminate consisting of a resin film and a copper foil which later form an insulating layer and a conductor layer, respectively.

On the other hand, this conventional method shown in FIG. 8A to FIG. 8D requires precise positioning between the via holes 86 and the lands 84 of the boards 90 and 91, and the fine apertures 87 of the copper foil 88, as they are superposed and united by applying heat and pressure. The positioning between via holes and lands is especially difficult, as lands in high density wiring have a very small diameter.

For example, in a conventional wiring level, if the land diameter is 0.3 mm and the via hole diameter 0.15 mm, the allowable range of error is ±0.53 mm in order that the via holes are inside the corresponding lands, whereas, in a high density wiring board, the land diameter and the via hole diameter are as small as 0.1 mm and 0.05 mm, respectively, in which case the allowable range of error would be ±0.018 mm. If the via hole is offset from the land, the electrical connection resistance increases or varies, which will lead to a problem.

High density boards use a 0.025 mm line/0.025 mm space wiring rule. However, with the chemical etching process, which is performed after forming a resist mask by exposing and developing a pattern in a resist film that is heat-bonded on the copper foil to form the wiring pattern including the lands 84 and the fine apertures 85, the line bottom of the circuit pattern may be made to be 0.025 mm wide, but the line top is usually reduced to approximately 0.015 mm wide by the side-etching effect. Such reduced pattern line width will make it difficult to mount semiconductor chips by wire bonding of gold wires, because the bonding points will easily be displaced from the pattern lines.

Multilayer circuit boards using conductive paste had the drawbacks that the electric resistance of the conductive paste was high and contact resistance between the paste and copper foil circuit was unstable, but various improvements have been made. In the case of using a 0.1 mm thick "B" stage prepreg made of aramid nonwoven cloth impregnated with epoxy resin to prepare multilayer circuit boards using conductive paste, when heat and pressure are applied to the prepreg and the copper foils in the uniting process, the prepreg is compressed between the copper foils and conductive fillers in the conductive paste make tight contact with each other and with the copper foil lands, whereby electrical connection is established. On the other hand, in the case of using a thin base material of about 0.025 mm thickness made of an insulating film such as polyimide and an adhesive layer for high density wiring boards, the thickness of the insulating material cannot be further reduced by compression, and therefore the wiring pattern including lands is embedded in the adhesive layer to increase the compression rate of the conductor paste layer, so that the conductive fillers make tight contact with each other and with the copper foil lands to establish electrical connection. With the above-described conventional board in which lands protrude from the insulating layer on the front surface of the board, the conductive paste could not be compressed enough to achieve the effect of reducing electrical connection resistance.

SUMMARY OF THE INVENTION

In view of the problems in the conventional techniques, an object of the present invention is to provide a multilayer circuit board having low electrical connection resistance and high reliability, and its manufacturing method which makes easy the positioning between lands and via holes and reduces mounting failures resulting from reduced line width of fine etched wiring patterns.

To achieve the above object, the present invention provides a multilayer circuit board, including a first wiring board, which consists of an insulating material and conductor layers forming wiring patterns on both sides of the insulating material, a via hole being formed through the insulating material and the conductor layers and filled with a conductive paste for interconnection, wherein a hole coaxial with the via hole is formed in the conductor layers.

With this structure, because of the holes in the conductor layers (lands) are connected to and matched in position with the via holes, the multilayer circuit board has reduced electrical connection resistance and improved reliability.

Preferably, the first wiring board is united with a second wiring board to form a multilayer circuit board, the second wiring board consisting of an insulating material and a conductor layer forming wiring patterns on one side of the insulating material, a via hole being formed through the insulating material and the conductor layer and filled with a conductive paste for interconnection, and a hole coaxial with the via hole being formed in the conductor layer.

Preferably, at least one of the conductor layers has the hole, and the hole has the same diameter as that of the via hole and is filled with a conductive paste.

The wiring pattern of the conductor layer is preferably embedded in the insulating material, so that conductive fillers in the conductive paste make tight contact with each other and with the copper lands to achieve lower electrical connection resistance.

A method for manufacturing a multilayer circuit board according to the present invention includes the steps of: forming a conductor layer of a wiring pattern on one side of a releasable carrier; laminating and bonding the conductor layer on respective sides of an insulating material; forming a via hole for interconnection; filling a conductive paste in the via hole; removing the releasable carrier from the conductor layer; and uniting the conductor layers with the insulating material by applying heat and pressure.

Preferably, the manufacturing method includes the steps of: preparing a core board by forming a conductor layer of a wiring pattern on one side of a releasable carrier, laminating and bonding the conductor layer on both sides of an insulating material, forming a via hole for interconnection, filling a conductive paste in the via hole, and removing the releasable carrier from the conductor layer; preparing a one-side board that is to be laminated upon the core board by forming a conductor layer of a wiring pattern on one side of a releasable carrier, laminating and bonding the conductor layer on one side of an insulating material, forming a via hole for interconnection, filling a conductive paste in the via hole, and removing the releasable carrier from the conductor layer; positioning and superposing the one-side board on the core board; and uniting the core board with the one-side board by applying heat and pressure.

The wiring pattern is formed by etching on the releasable carrier and transferred onto the insulating material. This way, the line bottom of the wiring patterns will be on the front side, whereby mounting failures that result from reduced line width of etched wiring patterns are reduced.

Preferably, a hole having the same diameter as the via hole is formed in a predetermined position of the wiring pattern in advance at the same time when the wiring pattern is formed, and in the step of forming a via hole, the via hole is formed by a laser beam irradiated from the side of the releasable carrier. This way, as the hole having the via hole diameter function as a laser mask when irradiating the laser beam, a via hole is formed in the insulating material with the same axial center and in the same position as the hole in the conductor layer (land).

In the laminating step, preferably, a via hole on the opposite side from the wiring pattern of the laminated one-side board is superposed on the wiring pattern of the core board.

While novel features of the invention are set forth in the preceding, the invention, both as to organization and content, can be further understood and appreciated, along with other objects and features thereof, from the following detailed description and examples when taken in conjunction with the attached drawings.

DETAILED DESCRIPTION OF THE PREFERRED EMBODIMENTS

Preferred embodiments of the multilayer circuit board and its manufacturing method of the invention will be described hereinafter with reference to FIG. 1 to FIG. 6. It should be understood that the description of the following specific examples is given for purposes of illustration only and not intended to limit the scope of the claims.

First Embodiment

Figure 1:
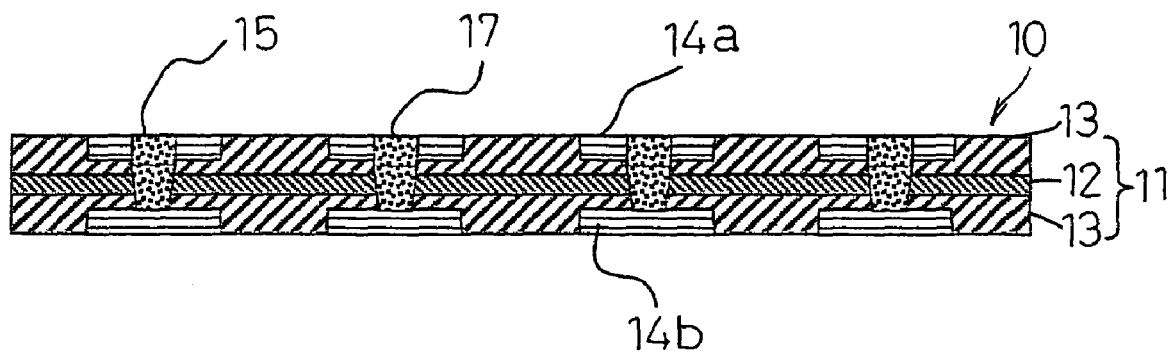
FIG. 1 is a cross-sectional view illustrating a multilayer circuit board according to a first embodiment of the present invention.

A first embodiment of the invention is described with reference to FIG. 1 to FIG. 3C. Referring to FIG. 1, a core board (first wiring board) 10, which is a multilayer circuit board with two conductor layers, consists of an insulating material 11 formed by an insulating film 12 and adhesive layers 13 on both sides of the film 12. Conductor layers of copper foil or the like (lands and wiring patterns) 14a and 14b are embedded in the adhesive layers 13. The conductor layer 14a on one side has holes 16 communicating with via holes 15 for the interconnection between both the conductor layers 14a and 14b. The via holes 15 and the holes 16 are filled with conductive paste 17.

The insulating material 11 is made of a 0.0125 mm thick polyimide film 12 and polyimide-based adhesive 13 applied on both sides of the film 12 in a thickness of 0.01 mm to form the three-layer structure.

The via holes 15 in the core board 10 are formed by a laser beam irradiated from the side of the conductor layer 14a. The laser beam is targeted at the holes 16 in the conductor layer 14a, using the holes 16 as a mask, so that the via holes 15 are formed coaxially with the holes 16 with the same diameter in the same positions.

The conductive paste 17, preferably, is composed of a powder of gold, silver, or copper as conductive filler, which is mixed with a thermosetting resin. Copper is most preferable as it has good conductivity and a small migration rate. As the thermosetting resin, liquid epoxy resin is preferably used because it is stable in terms of heat resistance.

The conductive paste 17 is filled by squeezing through the via holes 15 and the holes 16 from the side of the conductor layer 14a. In a heat press process in which the conductor layers 14a and 14b are embedded in the adhesive layers 13, the conductive paste 17 is compressed, so that a favorable electrical connection resistance is achieved.

The conductor layers 14a and 14b include 0.3 mm diameter lands and wiring patterns with a line width of 0.025 mm and a space of 0.025 mm formed by etching. The layers are formed such that the bottom side of the lands and the wiring patterns will be the front layer of the core board 10 and the multilayer circuit board, which will be described later. This prevents connection failures resulting from reduced pattern line width when mounting semiconductor chips on the board.

With this core board 10, the lands of the conductor layers 14a and 14b match in position with the via holes 15, electrical connection resistance is low, and semiconductor chips are mounted with high reliability. Thus the multilayer circuit board has high quality and suitable for high density mounting.

Figure 2A:
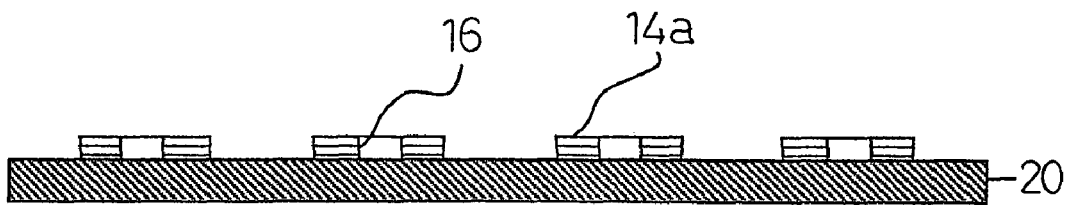
FIG. 2A to FIG. 2C are cross-sectional views illustrating the first half of process steps of a manufacturing method of the multilayer circuit board according to the first embodiment.

Next, the manufacturing process of the core board 10 is described with reference to FIG. 2A to FIG. 2C and FIG. 3A to FIG. 3C. A conductor layer 14a consisting of wiring patterns and lands which are made of 0.009 mm thick copper foil is formed on a 0.075 mm thick PET film releasable carrier 20, as shown in FIG. 2A. The releasable carrier 20 is removed after the conductor layer 14a is transferred. The carrier film is made of an organic polymer such as polyethylene or polyethylene terephthalate. The conductor layer 14a is formed by attaching metal foil such as copper foil on the releasable carrier 20 using silicone adhesive, or by electroplating performed on the metal foil. The conductor layer 14a is thus formed from a film of metal foil using existing techniques such as chemical etching processes. Holes 16 having the same diameter as the via holes are formed in predetermined positions of the conductor layer 14a at the same time when the wiring patterns are formed. Although, the other conductor layer 14b (not shown) consisting of wiring patterns and lands but without holes 16 is formed in a similar manner.

Figure 2B:
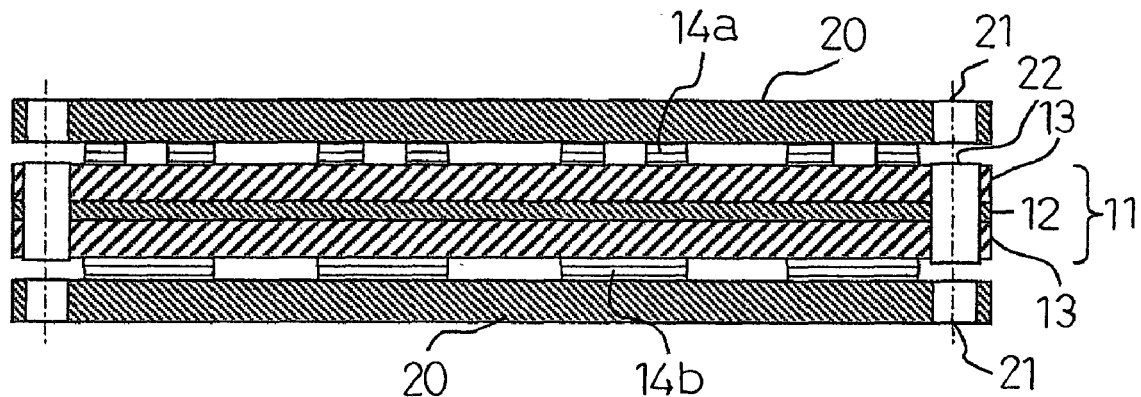

A laminating process follows next, in which the conductor layers 14a and 14b are bonded to both sides of the insulating material 11, which consists of an insulating film 12 and adhesive layers 13 on both sides of the film as shown in FIG. 2B. The conductor layers 14a and 14b on the releasable carriers 20 are arranged opposite each other, with the insulating material 11 between them, and bonded together using a vacuum laminator (MVLP-500 of Meiki Co., Ltd., for example). Positioning of the conductor layers 14a and 14b relative to each other is achieved using a reference pin (not shown) inserted in a matching reference hole 21 in this embodiment. Part of the stacked carriers 20, with the insulating material 11 in between, is tacked by heat bonding (not illustrated) in the vicinity of the reference hole 21. As the part of the adhesive layers 13 on which heat and pressure are applied melts and cures, the insulating material 11 is locally bonded to the releasable carriers 20 on both sides. The insulating material 11 is provided with an escape hole 22 having a larger diameter than the reference hole 21.

Preferably, the insulating material 11 and the releasable carrier 20 with the conductor layers 14a and 14b should be prepared in the form of rolls (long sheet) for higher production efficiency. The positioning of the conductor layers 14a and 14b may be achieved, instead of the reference pin, by an alignment device with a camera having a recognition function. The polyimide-based adhesive layers 13 may be formed by bonding a film of thermoplastic polyimide (TPI) or TPI provided with thermosetting property.

Figure 2C:
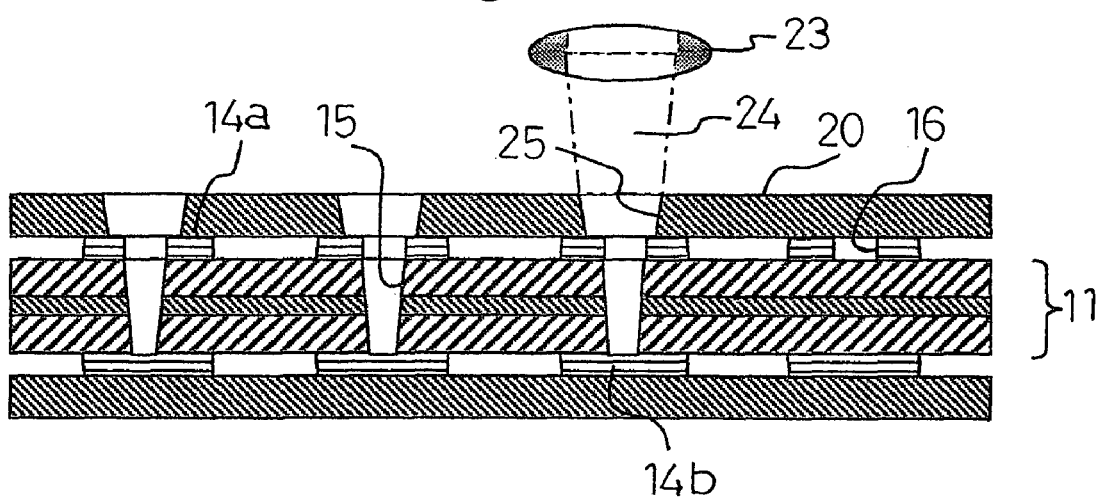

Next, a via hole forming process follows, in which via holes for interconnection are formed. As shown in FIG. 2C, a laser beam 24 from a carbonic acid gas laser oscillator is focused by a focusing lens 23 and irradiated at holes 16 in the conductor layer 14a. The beam spot of the carbonic acid gas laser 24 is adjusted to be about 0.12 mm above the conductor layer 14a, which is larger than the diameter of the holes 16. The laser beam 24 first bores a hole 25 in the PET releasable carrier 20 and reaches the conductor layer 14a, where the hole 16 formed in the copper conductor layer 14a works as a laser mask, so that a via hole 15 communicating with the hole 16 with the same diameter and axial center is formed in the insulating material 11. When the laser beam 24 reaches the conductor layer 14b, it is reflected by the surface of the conductor layer 14b.

The via hole 15 formed by carbonic acid gas laser has a truncated conical cross section, slightly tapering toward the conductor layer 14b. In this embodiment, the diameter of the via hole was 0.05 mm on the side of the conductor layer 14a, and 0.045 mm on the side of the conductor layer 14b. The hole 25 formed in the releasable carrier 20 had a diameter of approximately 0.13 mm.

While carbonic acid gas laser is used in this embodiment, other lasers, such as an ultraviolet laser, may of course be used. An fθ-lens and a galvanometer may be combined for high-speed processing and enhanced production efficiency.

Figure 3A:
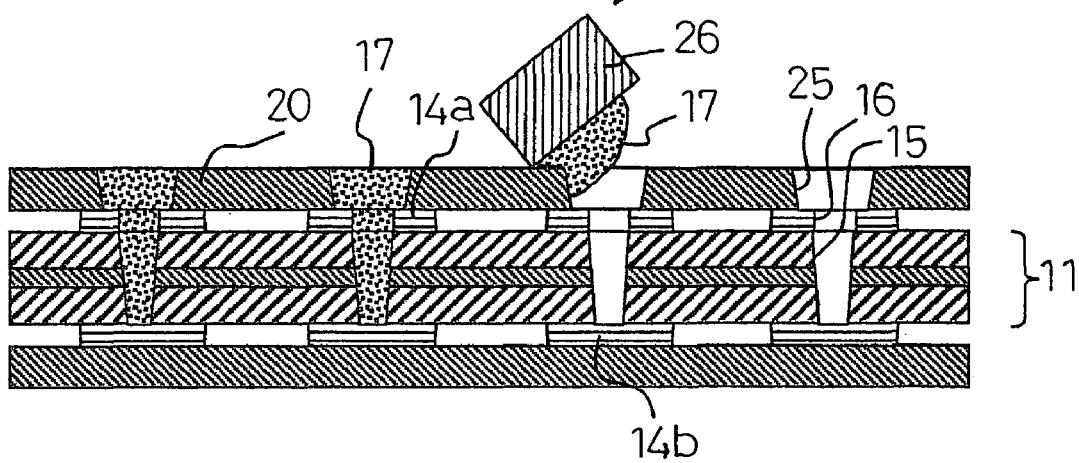
FIG. 3A to FIG. 3C are cross-sectional views illustrating the second half of process steps of the manufacturing method of the multilayer circuit board according to the first embodiment.

Next, a conductive paste filling process follows, in which conductive paste is filled in the via holes. As shown in FIG. 3A, a squeezee 26 is moved in the direction of the arrow, to fill the conductive paste 17 in the via holes 15, the holes 16 in the conductor layer 14a, and the holes 25 in the releasable carrier 20.

In this embodiment, the conductive paste contains 85 mass % of spherical copper particles with a mean diameter of 2 μm, 3 mass % of bisphenol-A epoxy resin and 9 mass % of glycizyl ester epoxy resin as resin compositions, and 3 mass % of amine adduct hardening agent, which are mixed to have a viscosity of 50 to 150 Pas. Here, as the releasable carrier 20 functions as a print mask, there is no need to provide a mask when filling conductive paste.

Figure 3B:
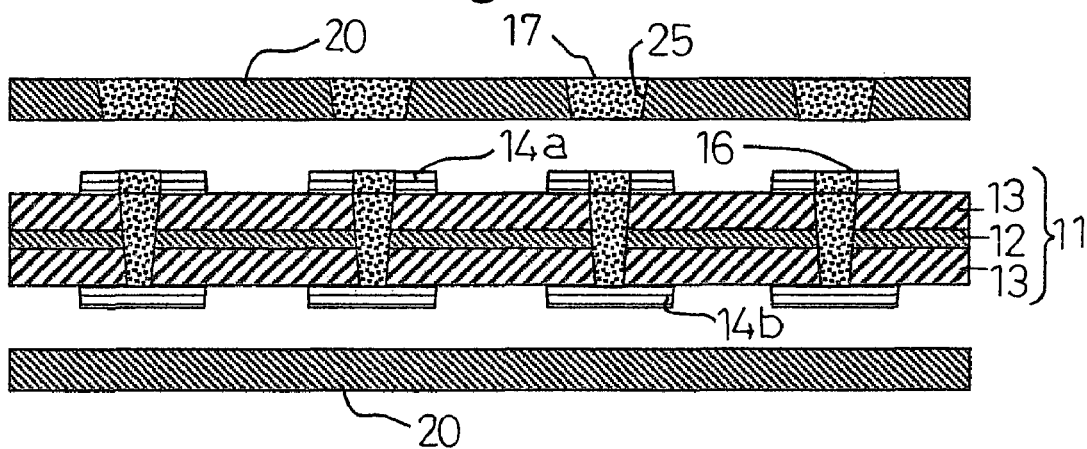

Next, a release process is performed, in which the releasable carriers 20 are removed from the conductor layers 14a and 14b. As shown in FIG. 3B, both carriers 20 are removed from the conductor layers 14a and 14b. As the carriers 20 are bonded to the conductor layers 14a and 14b with appropriate strength using silicone adhesive (not shown), they are removed at the interface between the carriers 20 and the conductor layers 14a and 14b. After the removal, the holes 25 bored by laser in the carriers 20 are still filled with the conductive paste 17. This is because the holes 25 have a diameter of 0.13 mm, which is larger than the diameter of the holes 16 (0.05 mm) in the conductor layer 14a, and the conductive paste is cut at the weak neck portion by stress when the carriers 20 are removed.

Figure 3C:
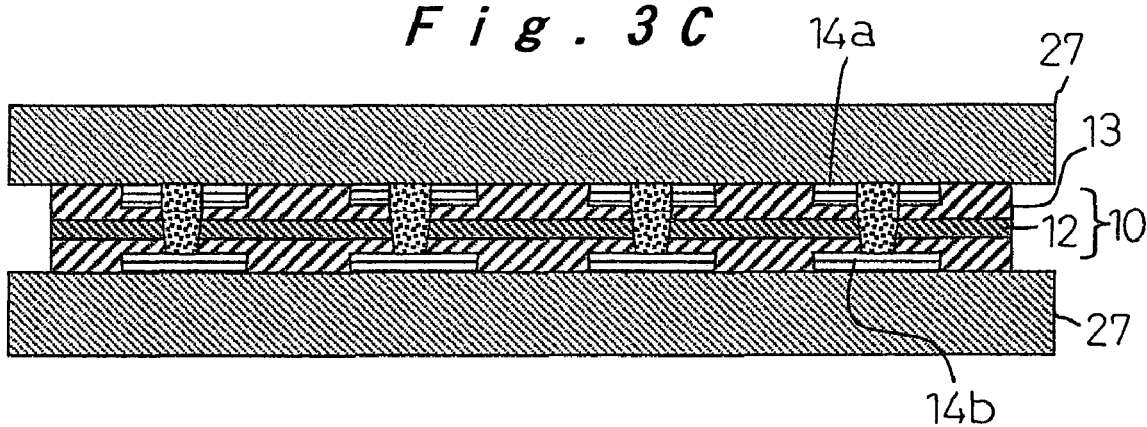

Next, a heat press process is performed, in which the conductor layers 14a and 14b and the insulating material 11 are united by applying heat and pressure. As shown in FIG. 3C, pressure application plates 27 are arranged on both sides of the insulating material 11, with which pressure of 5 MPa is applied at a temperature of 200° C. When heat and pressure are applied, the adhesive layers 13 first soften and then harden, so that the conductor layers 14a and 14b are embedded in the softened adhesive layers 13 and united with the insulating material after the adhesive has cured.

The core board 10 with two conductor layers shown in FIG. 1 is obtained as described above. This multilayer circuit board has low electrical connection resistance and improved reliability, and the above manufacturing method makes easy the positioning between lands in the conductor layers 14a and 14b and via holes 15 in the insulating material 11, and reduces mounting failures that result from reduced line width of fine etched wiring patterns. The core board 10 may be formed as a multilayer circuit board with built-in passive components, by providing resistors, capacitors and the like on the releasable carrier 20 by printing or the like, after forming the wiring patterns.

Second Embodiment

A second embodiment of the invention is described next with reference to FIG. 4 to FIG. 5C. The multilayer circuit board of this embodiment consists of the core board (first wiring board) of the previous embodiment and two other conductor layers (second wiring board) to form a four-layer structure. Same elements as those in the first embodiment are given the same reference numerals and will not be described again.

Figure 4:
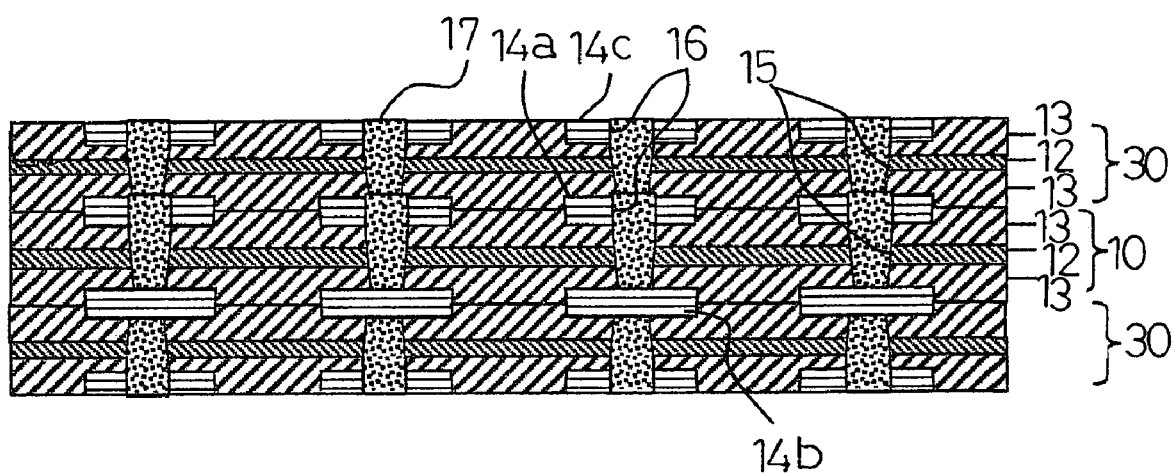
FIG. 4 is a cross-sectional view illustrating a multilayer circuit board according to a second embodiment of the present invention.

In FIG. 4, the reference numeral 10 denotes the same core board (first wiring board) as in the previous embodiment. Two other boards (second wiring board) 30 are laminated on both sides of the core board 10. Each laminated board 30 is an insulating material 11 consisting of an insulating film 12 and adhesive layers 13 on both sides of the film. A conductor layer 14c of copper foil or the like including lands and wiring patterns is embedded in one adhesive layer. The conductor layer 14c is provided with holes 16 that connect to via holes 15 for interconnection. The via holes 15 and the holes 16 are filled with conductive paste 17. The boards 30 are attached to the conductor layers 14a and 14b of the core board 10 such that their conductor layers 14c are on the front side, to form a four-layer circuit board.

Since the conductor layers 14a and 14b of the core board 10 are embedded in the multilayer circuit board, they are formed of double treated copper foil, and have a thickness twice larger than the conductor layers 14c on the front side so as to achieve lower electrical connection resistance by compression of the conductive paste 17 in the laminated boards 30.

While four conductor layers 14a to 14c are formed in this embodiment, the invention is not limited to this structure and the board may have more layers.

Figure 5A:
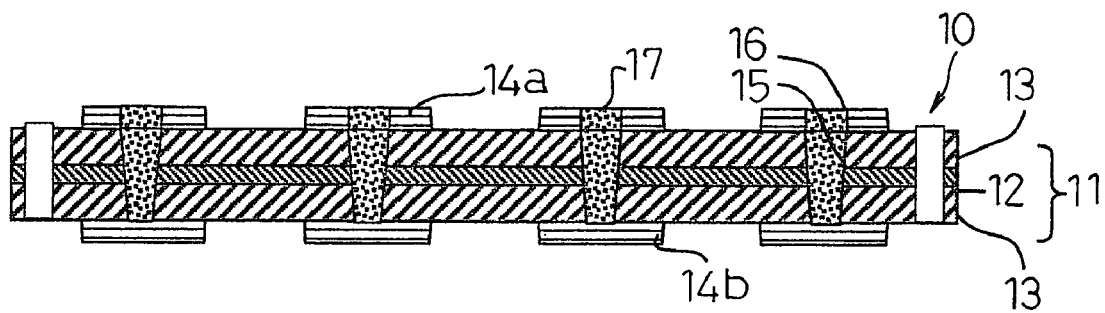
FIG. 5A to FIG. 5C are cross-sectional views illustrating process steps of a manufacturing method of the multilayer circuit board according to the second embodiment.
Figure 5B:
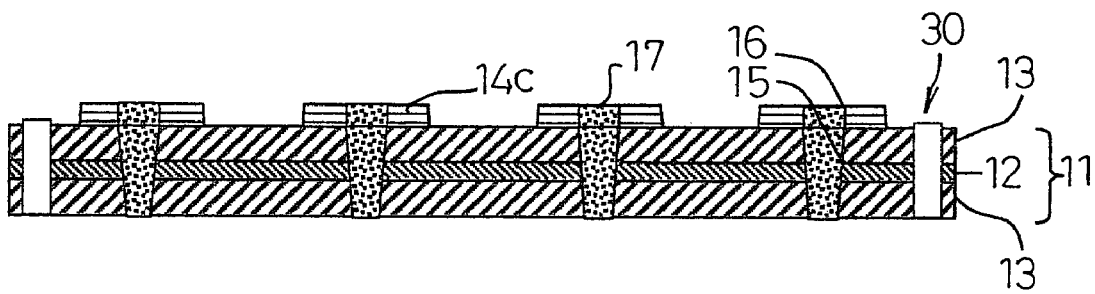
Figure 5C:
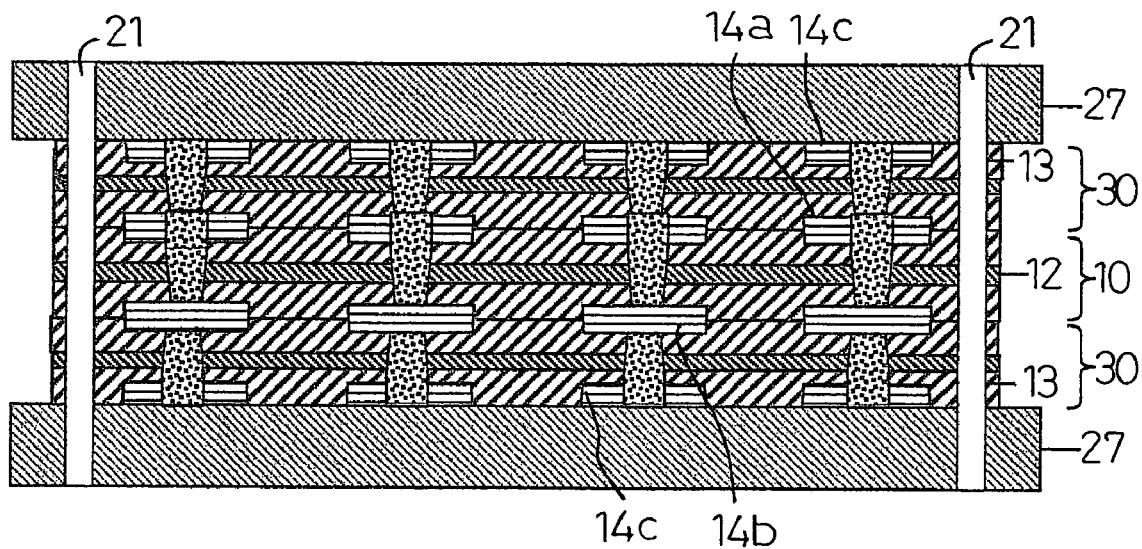

The manufacturing process of this four-layer circuit board is described with reference to FIG. 5A to FIG. 5C. FIG. 5A shows a core board 10, which is obtained by removing the releasable carriers 20 shown in FIG. 3B from the conductor layers 14a and 14b. FIG. 5B shows a board 30 to be laminated, which is obtained by removing a releasable carrier 20 that has held the conductor layer 14c thereon. The conductor layer 14c in this embodiment is a single treated copper foil with a thickness of 0.009 mm. The process of obtaining the boards as shown in FIG. 5A and FIG. 5B is the same as that of the previous embodiment except that the conductor layer 14c is formed on one side and so it will not be described again.

Next, a heat press process is performed. As shown in FIG. 5C, the two boards 30 are arranged opposite the conductor layers 14a and 14b of the core board 10, respectively, such that the conductor layers 14c are on the front side, and they are positioned relative to the core board 10 using reference holes 21 and pins (not shown), and heat and pressure are applied with the pressure application plates 27. When heat and pressure are applied, the adhesive layers 13 first soften and then harden, so that the conductor layers 14a to 14c are embedded in the softened adhesive layers 13 and united with the insulating material after the adhesive has cured.

The multilayer circuit board with four conductor layers shown in FIG. 4 thus produced has low electrical connection resistance and improved reliability, and the above manufacturing method makes easy the positioning between lands in the conductor layers 14a to 14c and via holes 15 in the core board 10 and the laminated boards 30, and reduces mounting failures that result from reduced line width of fine etched wiring patterns.

Third Embodiment

A third embodiment of the invention is described next with reference to FIG. 6. The multilayer circuit board of this embodiment consists of the core board (first wiring board) of the first embodiment and another conductor layers on both sides of the core board to form a four-layer structure. The difference from the second embodiment is that the laminated boards (second wiring boards) 31 consist of an insulating film 12 and an adhesive layer 13 on only one side of the film. Other features are the same as the second embodiment and will not be described again. Also, the manufacturing method of this embodiment is substantially the same as that of the second embodiment, except that the conductor layers 14a and 14b of the core board 10 are a 0.009 mm thick copper foil, and will not be described again.

Figure 6:
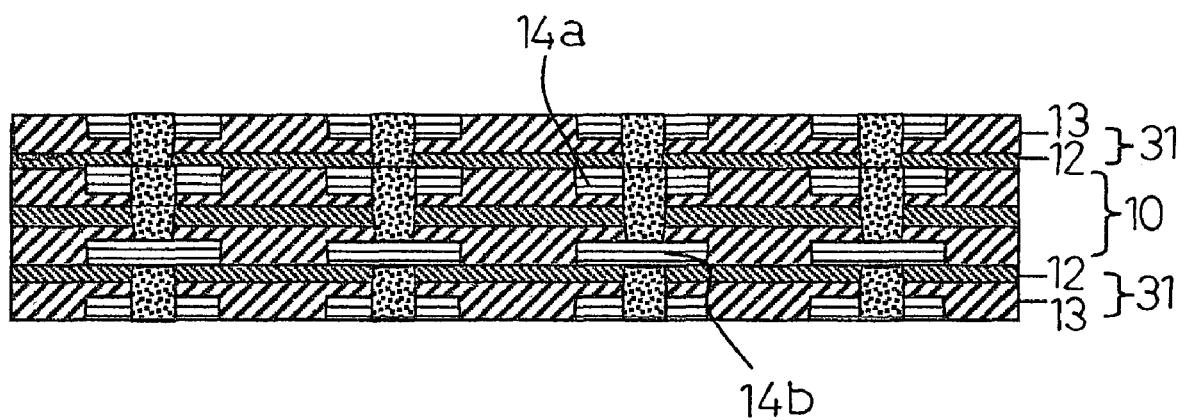
FIG. 6 is a cross-sectional view illustrating a multilayer circuit board according to a third embodiment of the present invention.
Figure 7A:
FIG. 7A to FIG. 7H are cross-sectional views illustrating process steps of a manufacturing method of a conventional multilayer circuit board.
Figure 7B:
Figure 7C:
Figure 7D:
Figure 7E:
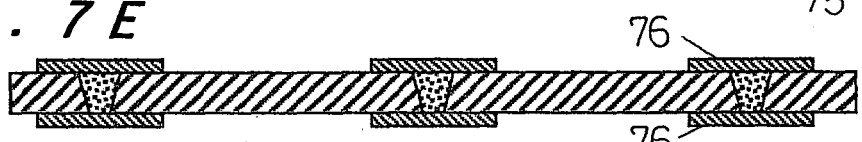
Figure 7F:
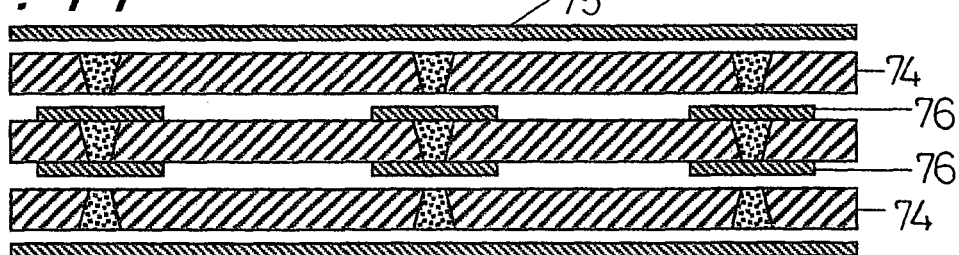
Figure 7G:
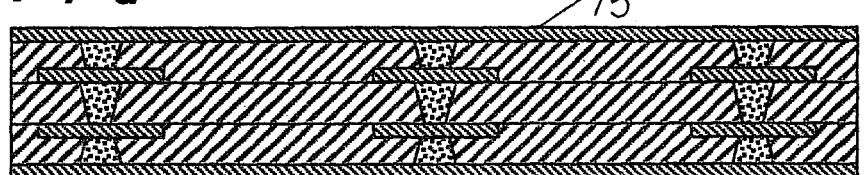
Figure 7H:
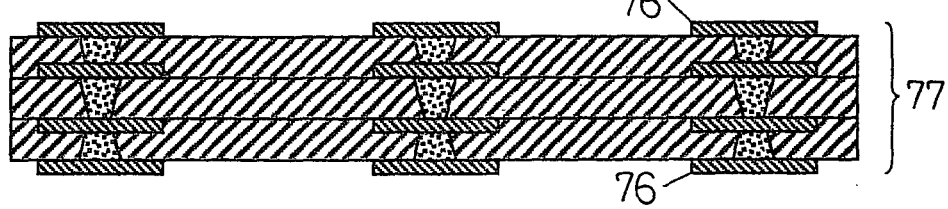
Figure 8A:
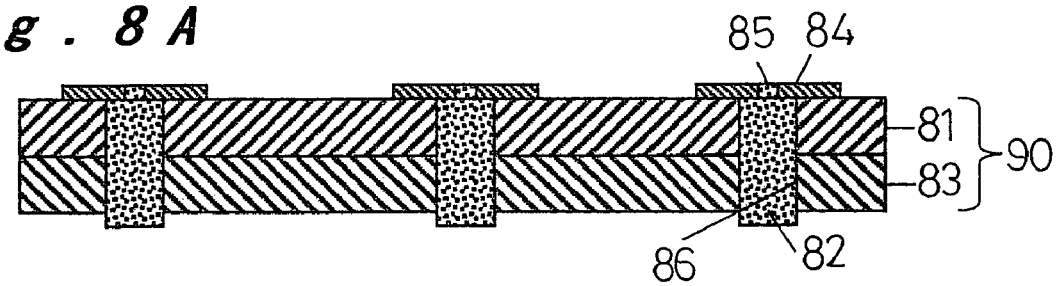
FIG. 8A to FIG. 8D are cross-sectional views illustrating process steps of a manufacturing method of another conventional multilayer circuit board.
Figure 8B:
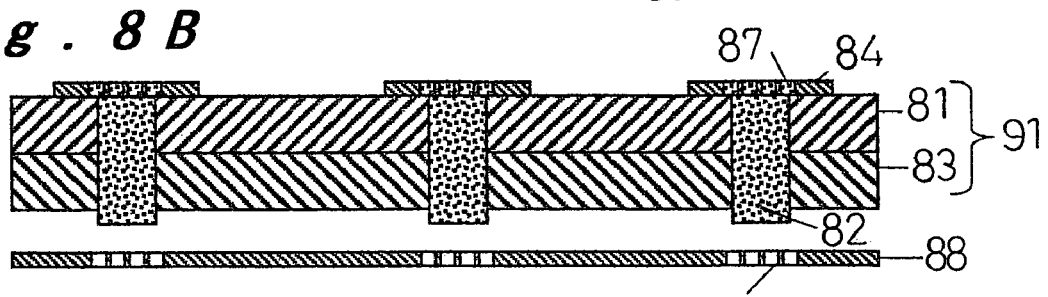
Figure 8C:
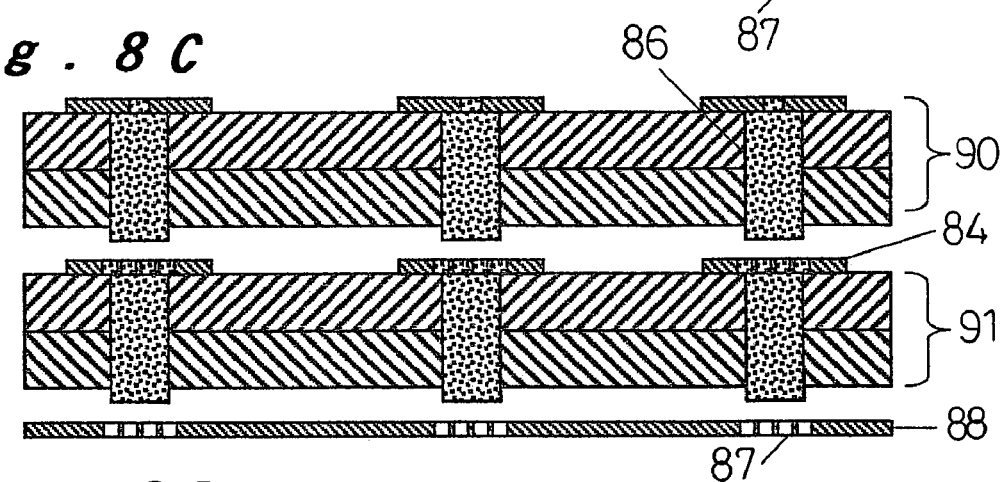
Figure 8D:
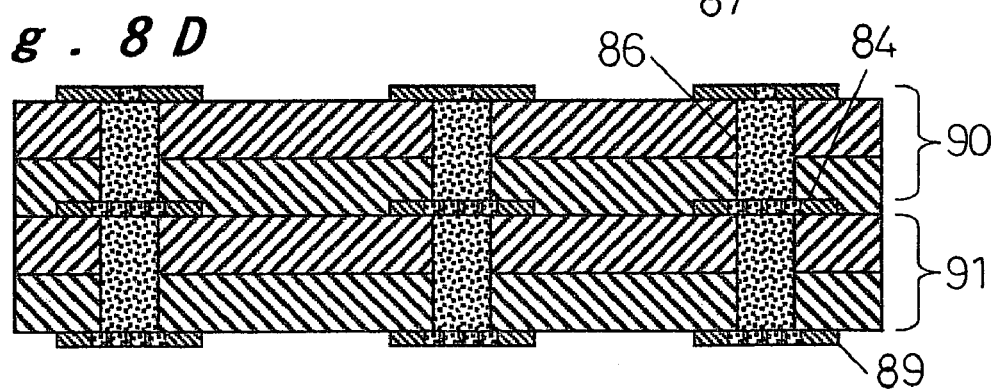

The multilayer circuit board with four conductor layers shown in FIG. 6 thus produced has low electrical connection resistance and improved reliability, and the above manufacturing method makes easy the positioning between lands in the conductor layers 14a to 14c and via holes 15 in the core board 10 and laminated boards 31, and reduces mounting failures that result from reduced line width of fine etched wiring patterns. Further, the multilayer circuit board of this embodiment is thinner because of the adhesive layer 13 being provided on only one side.

With the manufacturing method of the present invention, because of the holes in the conductor layers (lands) that are connected to and matched in position with via holes, a multilayer circuit board having reduced electrical connection resistance and high reliability is obtained. The board thus obtained is thin and allows high density wiring, and it is suitably used for a semiconductor module board.

Although the present invention has been fully described in connection with the preferred embodiment thereof, it is to be noted that various changes and modifications apparent to those skilled in the art are to be understood as included within the scope of the present invention as defined by the appended claims unless they depart therefrom.

What is claimed is:

1. A multilayer circuit board comprising:
   an insulating film comprising two opposing sides;
   two adhesive layers, one on each of the opposing sides of said two opposing sides of the insulating film;
   a pair of conductor layers opposite to each other, and each of said pair of conductor layers being embedded in one of said two adhesive layers;
   a first hole formed in truncated conical shape through the insulating film and said two adhesive layers;
   a second hole formed in at least one of the pair of conductor layers to be coaxial with the first hole; and
   a conductive paste filled in the first hole and second hole compressed accompanying with the embedding of the pair of conductor layers and in conductive contact with said pair of conductor layers.

2. The multilayer circuit board according to claim 1, wherein the core board is united with a second wiring board to form a multilayer circuit board, the second wiring board comprising an insulating material and a conductor layer forming wiring patterns on one side of the insulating material, a via hole being formed through the insulating material and the conductor layer and filled with a conductive paste for interconnection, and a hole coaxial with the via hole being formed in the conductor layer.

3. The multilayer circuit board according to claim 1, wherein each of the pair of conductor layers includes the second hole.

4. The multilayer circuit board according to claim 1, wherein diameters at a portion wherein said second hole and said first hole contact are the same.

* * * * *